United States Patent
Anderson

(10) Patent No.: US 7,381,448 B1
(45) Date of Patent: *Jun. 3, 2008

(54) LIMONENE, PINENE, OR OTHER TERPENES AND THEIR ALCOHOLS, ALDEHYDES AND KETONES, AS POLYMER SOLVENTS FOR CONDUCTING POLYMERS IN AQUEOUS AND NON-AQUEOUS COATING FORMULATIONS AND THEIR USES

(75) Inventor: Nicole Marie Anderson, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/472,511

(22) Filed: Jun. 14, 2006

Related U.S. Application Data

(63) Continuation of application No. 10/817,114, filed on Apr. 2, 2004, now Pat. No. 7,166,664, which is a continuation-in-part of application No. 10/714,296, filed on Nov. 14, 2003, now abandoned.

(51) Int. Cl.
*B05D 1/00* (2006.01)
(52) U.S. Cl. .................................. 427/388.5
(58) Field of Classification Search ............... 427/388.5
See application file for complete search history.

(56) References Cited

U.S. PATENT DOCUMENTS

| | | | |
|---|---|---|---|
| 5,814,376 A | 9/1998 | Cabelli | |
| 5,932,643 A | 8/1999 | Kenny | |
| 6,762,234 B2 * | 7/2004 | Grizzi | 524/474 |
| 6,951,666 B2 * | 10/2005 | Kodas et al. | 427/376.6 |
| 2006/0115652 A1 * | 6/2006 | Yoshimoto et al. | 428/411.1 |

* cited by examiner

*Primary Examiner*—Peter Szekely
(74) *Attorney, Agent, or Firm*—Brian F. Drazich

(57) ABSTRACT

A low-VOC (volatile organic compound) and/or low-toxicity coating formulation, including at least one non-halogenated solvent including terpene(s) or terpenoid(s), and at least one polymer including conducting polymers, electroactive polymers and/or conjugated polymers, wherein the polymers and non-halogenated solvent(s) are in non-aqueous form. In other embodiments, coating formulations, includes about 0.01% wt. to about 99.9% wt. of at least one non-halogenated solvent including a terpene or terpenoid, about 0.01% wt. to about 90% wt. of at least one polymer including conducting polymers, conjugated polymers, and electroactive polymers, and about 0.001% wt to about 90% wt. of at least one surfactant, wherein the polymers, solvents, and surfactants are in non-aqueous form. Also included are aqueous low VOC and/or toxicity coating formulations having at least one non-halogenated solvent including terpene(s) or terpenoid(s), and at least one conjugated, electroactive, or conductive polymer, copolymer, block polymer, and mixtures thereof.

5 Claims, No Drawings

LIMONENE, PINENE, OR OTHER TERPENES AND THEIR ALCOHOLS, ALDEHYDES AND KETONES, AS POLYMER SOLVENTS FOR CONDUCTING POLYMERS IN AQUEOUS AND NON-AQUEOUS COATING FORMULATIONS AND THEIR USES

CROSS REFERENCE TO RELATED APPLICATIONS

This application claims priority under 35 U.S.C. § 119(e) and is a continuation of U.S. patent application Ser. No. 10/817,114, filed Apr. 2, 2004, U.S. Pat. No. 7,166,664, which is a continuation-in-part of U.S. patent application Ser. No. 10/714,296 filed Nov. 14, 2003, now abandoned, which are hereby incorporated by reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The present invention relates to coating formulations including terpenes or terpenoids and their alcohols as solvents with conducting polymers, and more specifically, the use of terpenes to permit polymer incorporation into non-toxic or low-toxicity, non-VOC (Volatile Organic Carbons) or low-VOC aqueous and non-aqueous formulations for various military, commercial, and recreational applications.

BACKGROUND OF THE INVENTION

Terpenes are natural solvents existing both in the citrus fruits and in many other plants, with extraordinary technical and chemical properties. Terpenes include any hydrocarbon of the formula $C_5H_8$ and are derivable chiefly from essential oils, resins, and other vegetable aromatic products. Many terpenes are acyclic, bicyclic, or monocyclic, and differ somewhat in physical properties. They can represent an optimal alternative to halogenated solvents in many civil and industrial applications.

Nearly all the terpenes, contained in the essential oils of many plants, are constituted by a skeleton of carbon atoms made of isoprene ($C_5H_8$) units regularly linked according with the head-tail position. Some components are shown in the following formulas. The main component of the essential citrus fruit oil is d-limonene, commonly called dipentene, a hydrocarbon insoluble in water. When the essential oils are used to flavor something, it's necessary to bring them in a very thin suspension in the aqueous product (soft drinks, juices, etc.). Terpenes are typically environmentally safe and can reduce the environmental impact in many applications related to the organic solvent use.

U.S. Pat. No. 5,814,376 issued on Sep. 29, 1998 to Michael D. Cabelli teaches a gravure coating process for producing electroconductive polymer films. The coating is for use in sensors detecting analytes and the final product is heated. The above patent is limited to a ribbon-like or flat substrate application. The above uses a conductive polymer and exposing it to a dopant thereby changing its properties in situ. By changing it's properties they teach that it can be used as a component in a measuring device. This patent does not teach the use of terpenes with conductive polymers for corrosion inhibition. Ideally, in the present invention, once used or applied, the polymer will not be changed, modified or doped. The polymer will continue to perform (prevent corrosion) if it remains in a constant state. While the details of the mechanism for corrosion protection/inhibition has not been published for conductive polymers, it is likely to be a passivation of the metal substrate or an ability to allow electron transfer between the coating and substrate to prevent localized charge buildup at a metal surface, thereby eliminating corrosion. By preventing a localized charge buildup at a metal surface or between two surfaces that have different oxidation potentials, it's likely that the conductive polymer inhibits the oxidation of metal and therefore the formation of corrosion products.

U.S. Pat. No. 5,932,643 issued on Aug. 3, 1999 to Frank J. Kenny teaches coating formulations and thermal transfer ribbons that form printed images containing conductive polymers. The formulations and ribbons include wax, polymer resins, a sensible material and optional solvent. The above is teaching the polymer coatings for their thermal transfer properties. They teach utilizing toxic organic solvents, which have been used for conductive polymers long before this patent was issued. However, no terpenes or terpenoids are taught for use in this patent.

If paint formulations use limonene, pinene, or other terpenes (or terpenoids), as a solvent in a non-water based coating applications instead of traditional high-VOC (volatile organic compound) solvents, it will provide a low-VOC coating application. There is currently no non-toxic, non-chrome, non-metallic, non-aqueous containing coating formulation approved for military application. From the foregoing, it will be appreciated that there is a need in the art for organic terpene non-aqueous based solvent/conducting polymer coating compositions, which is environmentally safe for various types of military and commercial applications. The present invention is directed to overcoming one, or more, of the problems set forth above.

SUMMARY OF THE INVENTION

The present invention relates to low-VOC (volatile organic compound) and/or low-toxicity coating formulations, including at least one non-halogenated solvent including terpene(s) or terpenoid(s) and at least one polymer comprising one of conducting polymers, electroactive polymers and/or conjugated polymers, wherein the non-halogenated solvent(s) and polymer(s) are in non-aqueous form. In another embodiment, the present invention includes a low-VOC (volatile organic compound) and/or low-toxicity coating formulation, including about 0.01% wt. to about 99.9% wt. of at least one non-halogenated solvent including terpene(s) or terpenoid(s), about 0.01% wt. to about 90% wt. of at least one polymer comprising of conducting or electroactive polymer(s), conjugated polymer(s), and about 0.001% wt to about 90% wt. of at least one surfactant, wherein non-halogenated solvent(s), polymer(s), and surfactant(s) are in non-aqueous form. In other embodiments, the coating formulations include at least one of co-polymer, block polymer, and mixtures thereof. Embodiments of the present invention further include aqueous low VOC and/or toxicity coating formulations having at least one non-halogenated solvent including terpene(s) or terpenoid(s), and at least one copolymer, block polymer, and mixtures thereof. The terpene or terpenoid includes at least one of dipentene (d-limonene), α-pinene, β-mircene, p-cimene, citronellolio, geraniale (citrale), nerol, beta-carotene, menthol, geraniol, farnesol, phytol, their homologs, derivative, enantiomers, isomers including constitutional isomers, stereoisomerisms, regioisomers, and geometric isomers, and any combination thereof. The conducting polymers include at least one of poly dialkylaminophenylene vinylene including poly [bis (N-methyl-N-hexylamino)phenylenevinylene] (BAMPPV) and polydialkoxyphenylenevinylene including poly[2-methoxy-5-(2'-ethylhexyloxy)-1,4-phenylenevinylene] (MEH-PPV), polyphenylene vinylenes, polythiophenes, polypyrroles, polyanilines, polyacetates, polyacetylenes, polyacrylates, polyazene, polystyrene, poly-N-vinylcarbazole, polyvinylpyridine, polyindole, copolymer, block polymer, and any combination thereof. The conducting (including electroactive or conjugated) polymers are in neutral, oxidized or reduced form, in the form of a salt including an emeraldine salt, or in any basic or acidic form.

The present invention is used with a broader range of application methods, particularly, spray coating and dip coating. These methods are the most useful for industry and the military on large substrates and substrates with complex geometries (crevices or holes that are hard to access) including aircraft and vehicle components.

It is to be understood that the foregoing general description and the following detailed description are exemplary and explanatory only and are not to be viewed as being restrictive of the present invention, as claimed. These and other objects, features and advantages of the present invention will become apparent after a review of the following detailed description of the disclosed embodiments and the appended claims.

DETAILED DESCRIPTION OF SPECIFIC EMBODIMENTS

The present invention relates to low-VOC (volatile organic compound) and/or low-toxicity coating formulations, including at least one non-halogenated solvent including terpene(s) or terpenoid(s) and at least one polymer comprising of conducting polymer(s), electroactive polymer(s) and/or conjugated polymer(s), wherein the non-halogenated solvent(s) and the polymer(s) are in non-aqueous form. In another embodiment, the present invention includes a low-VOC (volatile organic compound) and/or low-toxicity coating formulation, including about 0.01% wt. to about 99.9% wt. of at least one non-halogenated solvent including terpene(s) or terpenoid(s), about 0.01% wt. to about 90% wt. of at least one polymer comprising of conducting polymer(s), electroactive polymer(s), and conjugated polymer(s), and about 0.001% wt to about 90% wt. of at least one surfactant, wherein the non-halogenated solvent(s), polymer(s) and surfactant(s) are in non-aqueous form. In other embodiments of the present invention, the coating formulations include at least one of copolymers, block polymers, and mixtures thereof.

The following terpenes or terpenoids are constituted by a skeleton of carbon atoms made of isoprene unities regularly linked according with the head-tail position. The terpene or terpenoid includes at least one of dipentene (d-limonene), α-pinene, β-mircene, p-cimene, citronellolio, geraniale (citrale), nerol, beta-carotene, menthol, geraniol, farnesol, phytol, their homologs, derivative, enantiomers, isomers including constitutional isomers, stereoisomerisms, regioisomers, and geometric isomers, and any combination thereof. For example, Aldrich produces limonene in various optically active isomers and in a technical grade called "dipentene." Terpenes also function as stand-alone solvents or as co solvents. As a solvent or co solvent, a terpene will act as a vehicle for application of polymers (conductive or nonconductive) or conjugated polymers onto substrates. Terpenes function as alternative solvents for polymers, including conductive or electroactive polymers and conjugated polymers, to replace more traditional, more toxic solvents including but not limited to xylenes, tetrahydrofuran (THF), benzene, n-methylpyrrolidinone (NMP), methylene chloride, and other organic solvents.

Conjugated polymers have a framework of alternating single and double bonds. These consist of carbon heteroatom bonds including but not limited to carbon-carbon, carbon-nitrogen, carbon-oxygen, carbon-sulphur bonds. Conjugated polymers are polyunsaturated compounds in which most if not all backbone atoms are sp- or $sp^2$ hybridized. For the purposes of the present invention, the terms conductive, electroactive, and conjugated will be interchangeably utilized throughout. For the purposes of the present invention, a conductive polymer may include homopolymers, block polymers, copolymers, or mixtures thereof. The conducting polymers include at least one of polydialkylaminophenylenevinylene including poly [bis(N-methyl-N-hexylamino)phenylenevinylene] (BAMPPV) and polydialkoxyphenylenevinylene including poly[2-methoxy-5-(2'-ethylhexyloxy)-1,4-phenylenevinylene] (MEHPPV), polyphenylene vinylenes, polythiophenes, polypyrroles, polyanilines, polyacetates, polyacetylenes, polyacrylates, polyazene, polystyrene, poly-N-vinylcarbazole, polyvinylpyridine, polyindole, and any combination thereof. The conducting (including electroactive or conjugated) polymers are in neutral, oxidized or reduced form, in the form of a salt including an emeraldine salt, or in any basic or acidic form. The terpene or terpenoid solvent and conducting polymer formulations are in non-aqueous form comprising a solution, mixture, suspension, or emulsion. All terpenes, terpenoids, and polymers would ideally be non/low toxic and low VOC.

In other embodiments the coating formulations further include at least one of surfactant(s), solvent(s), either organic or inorganic, and other organic components. Triton X100 is a surfactant utilized in embodiments of the present invention; however, any surfactant commercially available will suffice that includes the following characteristics. The definition of a surfactant or surface-active agent (Random House) is "any substance that when dissolved in water or other aqueous solution reduces the surface tension or interfacial tension between it and another fluid." A surfactant is utilized with non-aqueous systems, for example, a solvent having a non-aqueous (pure) alcohol including ethanol, methanol, or propanol that have polar characteristics like water. The idea of a surfactant is to have different functionalities on the same molecule. This will enable two different types of molecules to be somehow somewhat miscible that normally would not be. The Triton X100 has a similar structure (carbon ring) to the polymer and the ether alcohol portion is similar to water (polar) so that the water and polymer may be somehow closely associated to form a suspension or solution rather than separating into two layers like oil and water.

In embodiments of the present invention, terpene and polymer solutions, mixtures, suspensions, or emulsions are added to organic coating systems. Above combinations are used to incorporate a polymer into an organic or inorganic coating or resin, including but not limited to epoxies, polyurethanes, polyamides, polyimides, polysulfides, polysiloxanes, polyvinyls, polyphenolics, polyxylenes, polyacrylics and polyesters. In embodiments of the present invention, organic resin includes, but is not limited to polyamides, phenolics, polypropylenes, and polyethylenes. The present coating formulations can be applied to a substrate including, but not limited to spray coating, dip coating, spin-coating, flow-coating, doctor blade coating, or screen-printing. The substrates include plastic, rubber, metal, metallic and like surfaces. Embodiments of the present invention are further utilized for corrosion protection as replacements for hexavalent chrome.

The present invention will now be explained with references to the following non-limiting experiments.

EXPERIMENTAL RESULTS

The following experiments are based on aqueous coating formulations. A series of terpene polymer solvent samples were prepared and analyzed. In the first experiment, approximately 5.6 mL of dipentene (d-limonene) (Aldrich) was added to beaker "A" with 0.0112 g of poly [bis(2,5-(N, N,N',N'-tetraalkyl)amino)-1,4-phenylene vinylene] (BAM-PPV). The results had shown that BAMPPV was slightly soluble almost immediately in the dipentene. The terpene/BAMPPV mixture was stirred and warmed on low. The BAMPPV polymer was solubilized in solution after 25 minutes.

In the second experiment, approximately 5.6 mL of α-pinene (Aldrich) was added to beaker "B" with 0.0103 g of BAMPPV. The results shown that the BAMPPV polymer was not immediately soluble in the α-pinene terpene as in the first experiment utilizing dipentene. The dipentene/BAMPPV and α-pinene/BAMPPV solutions were separately allowed to stir overnight. In the first experiment, the BAMPPV was completely dissolved in the dipentene solvent. In the second experiment, the BAMPPV was almost completely dissolved in the α-pinene solvent; however, a small amount of solids remained. These experiments have shown that the solubility of the BAMPPV polymer in α-pinene is far greater than in xylenes and THF. Previous solutions trying to dissolve xylenes and THF into a BAM-PPV (the BAMPPV was dissolved in the xylenes and THF) polymer batch had shown a solubility factor not greater than 0.01% (order of magnitude difference).

In the second experiment, 1 mL of water was further added to beaker "B" containing the α-pinene/BAMPPV solution and was stirred to form a suspension. Water was added in order to form a waterborne coating. An ideal formulation would contain as much polymer as possible (referred to as high solids loading) and as little solvent as possible. Since water is nontoxic and inexpensive compared to any other solvent (environmentally friendly terpene or not), maximizing the polymer content, water content and minimizing any organic solvent and surfactant was the goal in aqueous based coating formulations. In a third experiment, a 1% solution was made with 0.4338 g of BAMPPV and 42.95 g of dipentene. The solution in the third experiment was used for smaller test vial experiments. Smaller tests were done using different surfactants to evaluate their respective performance in the coating formulation. Ideally, a non-toxic surfactant that can give the desired results in the smallest quantity possible is the most useful from an environmental and economic point of view.

In a fourth experiment, a vial of 9.904 g of dipentene was added to 0.1004 g of BAMPPV. The dipentene/BAMPPV solution was further diluted to 0.5% by adding 10.33 g of dipentene. A few milliliters of water were added to form a suspension. After sitting for an hour, a separation was observed. Then 2 drops of Triton-X100 (a surfactant) were added and the mixture was stirred for approximately 1 minute and an excellent suspension resulted. The composition remained in a suspension for a few days. After one week, separation was observed. Upon mixing the solution again for a few minutes, the suspension was again observed. The vial was then allowed to sit without stirring. The suspension was observed to be stable for at least 5 hours. Due to the concentrations of water and weight of Triton-X100 not being precisely measured, this experiment needed to be repeated.

In the fifth and sixth experiments, compositions including BAMPPV in dipentene were added with different surfactants to observe the surfactant performance. The surfactants were obtained from Osi Specialties (Greenwich, Conn.) including A1100 (gamma-aminopropyltriethoxysilane), A 1101 (gamma-aminopropyltriethoxysilane) technical grade, A1170 (bis-(gamma-triethoxysilypropyl)amine), and Y9669 (n-phenyl-gamma-aminopropyltrimethoxysilane). These additional surfactants were compared to the Triton-X100 (polyoxyethylene (10) isooctylcyclohexylether also known as alkylaryl polyether alcohol).

Further experiments were also performed to determine terpene use with conducting polymers. Vial 1: 44.0170 g of dipentene was added to 0.4408 g of polymer for a 1% solution. Vial 2: 16.9421 g of dipentene was added to 0.3369 g of polymer for a 2% solution. Vial 3: 16.9133 g of dipentene was added to 0.5076 g of polymer for a 2.9% solution. Vial 4: 4.9960 g of DI water was added to 4.2717 g of the 1% solution. Then 3 drops of Triton X100 (1 drop=0.0249 g) was added to the vial. After addition of 3 drops Triton X100, slight separation was noted at bottom, clearer layer on bottom (not completely clear). Vial 5: 2.0447 g of DI water was added to 4.3224 g of the 1% solution. Then 1 drop of Triton X (5 drop=0.0249 g) was added to the vial. Vial 6: 1.910 g of DI water was added to 4.2712 g of the 1% solution. Then 3 drops of Triton X (1drop=0.0249 g) was added to the vial. Vial 7: 1.9773 g of DI water was added to 4.3381 g of the 1% solution. Then 2 drops of Triton X (1drop=0.0249 g) was added to the vial.

The results of the above experiments are as follows: 1% polymer/dipentene solution: 1.0005 g of polymer added to 98.9992 g of dipentene. Did not go completely into solution when stirred overnight, so heated and let stir overnight again. Vial A: 1.0245 g of water was added to 5.0468 g of limonene/polymer solution. 0.2693 g of Triton X100 was then added. Vial B: 3.0188 g of water was added to 5.0421 g of limonene/polymer solution. 0.2630 g of Triton X100 was then added. Vial C, 5.0184 g of water was added to 5.0455 g of limonene/solution. 0.2491 g of Triton X100 was then added.

Vial D: 0.2462 g of Triton X100 was added to 5.0477 g of limonene/polymer solution. 1.0349 g of water was added to the limonene and Triton X100. Vial E: 0.2845 g of Triton X was added to 5.0493 g of limonene/polymer solution. 3.0154 g of water was added to the limonene and Triton X100. Vial F: 0.2620 g of Triton X was added to 5.0233 g of limonene/polymer solution. 5.0168 g of water was added to the limonene and Triton X100. When adding water after Triton X, a precipitate formed on the bottom of the vial more often than when water was added before Triton X. But, after stirring for a while, both group ABC and group DEF started to look the same. Vials A and D appeared good, but some initial separation was noticed in B, C, E, and F.

Additional terpenes and conducting polymers experiments were performed with the following results. Vial G: 1.7914 g of dipentene was added to 0.0200 g of Poly(3-hexylthiophene-2,5-diyl) regiorandom. Vial H, 1.8051 g of pinene was added to 0.0200 g of Poly(3-hexylthiophene-2,5-diyl) regiorandom. Vial I: 1.8015 g of dipentene was added to 0.0207 g of MEH-PPV. Vial J: 1.8053 g of pinene was added to 0.0218 g of MEH-PPV. Vial K: 1.8004 g of dipentene was added to 0.0261 g of Poly(3-hexylthiophene-2,5-diyl) regioregular. Vial L: 1.8024 g of pinene was added to 0.0226 g of Poly(3-hexylthiophene-2,5-diyl) regioregular.

H and G are fully soluble, K and L are mostly soluble, and I and J are mostly soluble. 24 hours later, all vials appear in the same condition all the previous day. The solutions from vials G through L were filtered with 0.2 micron syringe filters to remove any remaining solids. The solutions were then used in waterborne formulations. The solutions were filtered into new vials with designations 38A, 38B, 38C, 38D, 38E, 38E, and 38F corresponding to vials G, H, I, J, K and L, respectively. One drop of Triton X100 was added to each vial and the contents stirred. Visual results were as follows: 38A was in solution after about 20 seconds. 38B was in solution after about 30 seconds. 38C and 38D were in solution after about 25 seconds. 38E and 38F were in solution for a few seconds and the separation occurred. 38A, 38B, 38C and 38D stayed in solution after a total of 2 drops of Triton X100 was added. After 2 minutes, mixtures of 38B and 38D began to separate. After 2 min 30 seconds mixtures 38A and 38C began to separate. Optimum ratios and stirring conditions are being established. Embodiments of the present invention further include aqueous low VOC and/or toxicity coating formulations having at least one non-halogenated solvent including any terpene or terpenoid, and at least one conjugated, electroactive, or conductive polymer, copolymer, block polymer, and mixtures thereof.

The following experiments of the present invention are based on non-aqueous coating formulations. Vial M: included 2.5192 g of 1% BAM-PPV in dipentene (by weight). Approximately 1.9450 g of 1-propanol was then added to Vial M. The vial was shaken vigorously and stirred. The contents of the Vial M were miscible. The contents appeared as a transparent orange-red solution. Additional 1-propanol was added for a total of 4.3089 g. The vial was again shaken and stirred. The contents were still miscible. After sitting for approximately 10 minutes, there appeared to be a slight cloudiness due to a small amount of polymer precipitation or micelle formation. Any precipitate still appeared to be suspended and the mixture still appeared as a good sprayable material.

Vial N: included 0.0072 g of dry BAM-PPV. Approximately 2.4041 g of 1-propanol was then added. Dipentene was added dropwise until 0.6078 grams was added. The contents were stirred overnight on low heat. After approximately 15 hours, some of the solids had been dissolved, however, a significant amount of solids remained. After allowing the contents to sit without agitation for over 4 hours, there is a slight amount of precipitation seen at the bottom of the vial. Gentle shaking causes the particles to become suspended again. Vial 0: includes 0.5760 g of a 1% solution (by weight) of MEH-PPV in dipentene. Approximately 1.3136 g of 1-propanol was then added to the vial and it's contents shaken vigorously and stirred. The contents were slightly cloudy (possibly micelles). The contents were allowed to stir overnight on low heat. After approximately 15 hours, there was no visible change. The contents appeared as a very slightly cloudy red liquid. After allowing the contents to sit without agitation for over 4 hours, there is a slight amount of precipitation seen at the bottom of the vial. Gentle shaking causes the particles to become suspended again.

Vial P: included 0.9704 g of 1% solution of BAM-PPV in dipentene. Approximately 1.7221 g of 100% ethanol (ethyl alcohol) was then added. The contents were shaken vigorously. The contents were miscible, a red transparent liquid resulted. Vial Q: included 0.6081 g of MEH-PPV. Approximately 0.6830 g of 100% methanol was then added. An additional 0.4596 g of methanol was then added for a total of 1.1426 g of methanol. The contents appeared to be miscible but a slight precipitation or possible micelle formation may have occurred just after addition was complete. The contents appeared to be a very slightly cloudy, red liquid. Vial R: included 0.8612 g of 1% BAM-PPV in dipentene solution. Approximately 0.7146 g of 100% methanol (methyl alcohol) was then added. The contents appeared to be miscible until approximately one half of the methanol was added, at which point the solution became slightly cloudy. After the mixture was allowed to sit with no agitation for approximately 10 minutes, a precipitation appeared on the bottom of the vial. Agitation caused the particles to be suspended but precipitation reoccurred. Additional heating and shearing of this or any similar mixtures are likely to increase suspension lifetime.

Embodiments of the present invention are included, but not limited to the following uses: light-emitting devices, photovoltaic cells, capacitors, super capacitors, devices for sensor protection against lasers, devices for optical switching and modulating, corrosion protection, adhesives, electromagnetic shielding (EMI), anti-biofouling, camouflage, chemical sensors. The use of terpenes or terpenoids to act as a solvent or co-solvent will permit the dispersion of a conducting polymer(s) into a non-aqueous form in solution, suspension, emulsion, or mixture. Embodiments of the present invention including conductive polymers are used to reduce or inhibit corrosion in organic coatings when applied to plastic, rubber, metal substrates, or their interfaces.

Coatings including the present invention terpene/conducting polymer formulations are used as low-VOC (volatile organic compound) and/or low-toxicity coatings for items including but not limited to aircraft, vehicles, ground equipment, structures and architectural components. Low-VOC coatings are desirable since they should exhibit low-VOC emissions into the atmosphere and reduce hazardous materials exposure to those personnel that apply, repair, or remove such coatings. The coatings of the present invention would be amenable but not limited to applications on aircraft or ship hardware in compliance with State and Federal environmental regulations.

It should be understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A method for inhibiting the oxidation of a metallic surface comprising:
   providing a metallic surface;
   selecting at least one solvent from the group of terpenes;
   selecting at least one conductive polymer from the group of polydialkylaminophenylenevinylenes;
   solubilizing said at least one polymer in said at least one solvent to form a polymeric composition;
   contacting the metallic surface with the polymeric composition;
   allowing said at least one conducting polymer contact with the metallic surface reducing localized charge buildup in the metallic surface.

2. The method of claim 1 wherein said at least one solvent is selected from the group of terpenoids.

3. The method of claim 1 or claim 2 wherein said group of polydialkylaminophenylenevinylenes is replaced by the group of polydialkyloxyphenylenevinylenes.

4. The method of claim 3 wherein said at least one polymer is poly[2-methoxy-5-(2'-ethylhexyloxy)-1,4-phenylenevinylene].

5. The method of claim 1 or claim 2 wherein said at least one polymer is poly [bis(N-methyl-N-hexylamino)phenylenevinylene].

* * * * *